(12) United States Patent
Pedersen et al.

(10) Patent No.: US 8,217,842 B2
(45) Date of Patent: Jul. 10, 2012

(54) ELECTRONIC DEVICE WITH EDGE SURFACE ANTENNA ELEMENTS AND RELATED METHODS

(75) Inventors: Anders P. Pedersen, Palm Bay, FL (US); Daniel A. Robison, Palm Bay, FL (US); Alan Mast, Melbourne Beach, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 13/240,376

(22) Filed: Sep. 22, 2011

(65) Prior Publication Data

US 2012/0030931 A1    Feb. 9, 2012

Related U.S. Application Data

(62) Division of application No. 12/164,756, filed on Jun. 30, 2008, now Pat. No. 8,044,861.

(51) Int. Cl.
*H01Q 1/38* (2006.01)
(52) U.S. Cl. .................................. 343/700 MS; 29/600
(58) Field of Classification Search ................... 343/702, 343/700 MS, 853; 29/600
See application file for complete search history.

(56) References Cited

U.S. PATENT DOCUMENTS

| | | | |
|---|---|---|---|
| 5,300,911 A | 4/1994 | Walters | 336/175 |
| 6,128,817 A | 10/2000 | Roester et al. | 29/606 |
| 6,345,989 B1 | 2/2002 | Mason et al. | 439/74 |
| 6,472,744 B1 | 10/2002 | Sato et al. | 257/723 |
| 6,548,766 B2 | 4/2003 | Daido | 174/261 |
| 6,721,187 B2 | 4/2004 | Hall et al. | 361/760 |
| 6,739,880 B2 | 5/2004 | Toyota | 439/74 |
| 7,009,570 B2 | 3/2006 | Durham et al. | 343/753 |
| 7,161,457 B2 | 1/2007 | Meadors et al. | 336/200 |
| 7,304,862 B2 | 12/2007 | Busletta et al. | 361/760 |
| 8,044,861 B2 * | 10/2011 | Pedersen et al. | 343/700 MS |
| 2004/0004574 A1 | 1/2004 | Wen et al. | 343/727 |
| 2004/0233024 A1 | 11/2004 | Almeida et al. | 333/246 |
| 2006/0001138 A1 | 1/2006 | Sakama et al. | 257/678 |
| 2006/0042831 A1 | 3/2006 | Rohde et al. | 174/262 |
| 2006/0267778 A1 * | 11/2006 | Gengel et al. | 340/572.8 |
| 2007/0107935 A1 | 5/2007 | Hash et al. | 174/365 |
| 2007/0152834 A1 * | 7/2007 | Mimura | 340/572.8 |
| 2008/0036673 A1 | 2/2008 | Yamagajo et al. | 343/793 |

* cited by examiner

*Primary Examiner* — Hoanganh Le
(74) *Attorney, Agent, or Firm* — Allen, Dyer, Doppelt, Milbrath & Gilchrist, P.A.

(57) ABSTRACT

An electronic device may include a multilayer circuit board having opposing major surfaces and edge surfaces extending between the opposing major surfaces, wireless processing circuitry on at least one of the opposing major surfaces, and an antenna element on at least one of the edge surfaces. The multilayer circuit board may include a conductive trace coupling the antenna element to the wireless processing circuitry.

19 Claims, 10 Drawing Sheets

ELECTRONIC DEVICE WITH EDGE SURFACE ANTENNA ELEMENTS AND RELATED METHODS

RELATED APPLICATIONS

This application is a divisional of Ser. No. 12/164,756 filed Jun. 30, 2008 now U.S. Pat. No. 8,044,861, the entire disclosure of which is hereby incorporated herein by reference.

FIELD OF THE INVENTION

The present invention relates to the field of multilayer circuit boards, and, more particularly, to multilayer circuit boards having antennas and related methods.

BACKGROUND OF THE INVENTION

An electronic device may include one or more circuit boards. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a plastic material.

A simple circuit board may include conductive traces on its surface for connecting the electronic components to each other. As electronic circuitry has become more complex, multi-layer circuit boards with at least two electrically conductive trace layers sandwiched between dielectric layers have been developed. Typically, the different conductive trace layers of a multi-layer circuit board may be connected through vertically extending vias, which comprise conductive materials, for example, metal.

In certain applications, it may be desirable to interconnect two circuit boards arranged at a 90 degrees angle, each having electrically conductive pads on the major surfaces thereof. In other words, the edge surface of a first circuit board is mounted onto the major surface of the second circuit board. Moreover, this interconnection is typically accomplished using an interconnector component on the major surface of the second circuit board. Typically, the interconnector component physically couples the first and second circuit boards together and electrically couples the electrically conductive pads. The use of the interconnector component may increase the size of the assembled circuit boards. This may pose installation drawbacks in applications where space may be limited.

One approach to the above drawback is to interconnect circuit boards without using a separate interconnector component. For example, U.S. Pat. No. 6,345,989 to Mason et al. discloses a circuit board interconnector. The circuit board of Mason et al. includes conductive traces that extend outwardly beyond the edge surface of the circuit board, and contact pads provided thereon with a gap between the contact pads and the edge surface.

Another approach is disclosed in U.S. Patent Application Publication No. 2007/0107935 to Hash et al., also assigned to the assignee of the present application, Harris Corporation of Melbourne, Fla., the entire contents of which are incorporated by reference herein. Hash et al. discloses a method for fabricating contact pads within the edge surface of the first circuit board. The edge surface contact pads are coupled with the contact pads of the second circuit board. The method comprises drilling vias into each individual layer of the multilayer circuit board, filling each via with an electrically conductive material (providing cylinders within the layer), and milling the layer to bisect the cylinders. One drawback of the Hash et al. method is the expense per unit for manufacturing may be high. Moreover, the vias for each of the layers need to be accurately aligned, adding a possible drawback to robust fabrication.

In other applications, it may be desirable for an electronic device to have antenna elements on edge surfaces thereof. For example, as disclosed in U.S. Pat. No. 7,009,570 to Durham et al., also assigned to the present application's assignee, antenna elements may be formed on the edge surfaces of a flexible substrate. Moreover, Durham discloses a wideband phased array antenna including passive/active antenna elements on the edge and major surfaces, with the active antenna elements being coupled to a separate controller and a transceiver.

U.S. Patent Application No. 2008/0036673 to Yamagajo et al. discloses an RFID tag including a dielectric member, a loop antenna around the surface of the dielectric member, and an integrated circuit chip that is electronically coupled to the loop antenna by way of a chip-mounting pad on the dielectric member.

SUMMARY OF THE INVENTION

In view of the foregoing background, it is therefore an object of the present invention to provide edge surface antenna elements on a multilayer circuit board that are readily manufactured and coupled to adjacent circuitry.

This and other objects, features, and advantages in accordance with the present invention are provided by an electronic device that includes at least one multilayer circuit board having opposing major surfaces and edge surfaces extending between the opposing major surfaces, wireless processing circuitry on at least one of the opposing major surfaces, and at least one antenna element on at least one of the edge surfaces. The multilayer circuit board may comprise at least one conductive trace coupling the antenna element to the wireless processing circuitry. Advantageously, the electronic device is readily manufactured.

More particularly, the antenna element may comprise a feed portion coupled to the conductive trace, and a radiative portion coupled to the feed portion. In some embodiments, the antenna element may comprise at least one dipole antenna element. In other embodiments, the antenna element may comprise at least one monopole antenna element. In yet other embodiments, the antenna element may comprise at least one patch antenna element.

Additionally, the multilayer circuit board may comprise a ground plane therein extending parallel to the opposing major surfaces. The wireless processing circuitry may also comprise at least one of an amplifier, a phase shifter, and a filter.

More specifically, the wireless processing circuitry may be on a first one of the opposing major surfaces, and the electronic device may further comprise additional circuitry on a second one of the opposing major surfaces. In certain embodiments, the multilayer circuit board may further comprise a plurality of electrically conductive vias extending between the opposing major surfaces for coupling the wireless processing circuitry to the additional circuitry.

Another aspect is directed to a phased array antenna comprising a plurality of multilayer circuit boards arranged in side-by-side orientation. Each multilayer circuit board has opposing major surfaces and edge surfaces extending between the opposing major surfaces. Each multilayer circuit board may comprise wireless processing circuitry on at least one of the opposing major surfaces, at least one antenna element on at least one of the edge surfaces, and at least one conductive trace coupling the antenna element to the wireless processing circuitry.

Yet another aspect is directed to a method for forming at least one antenna element on at least one edge surface of a multilayer circuit board. The multilayer circuit board may be for mounting wireless processing circuitry on at least one major surface thereof. The multilayer circuit board may include at least one conductive trace for coupling to the wireless processing circuitry, the conductive trace having an exposed end on the edge surface of the multilayer circuit board. The method may include covering the edge surface of the multilayer circuit board with an electrically conductive layer, and selectively removing portions of the electrically conductive layer to define the antenna element electrically connected to the exposed end of the conductive trace.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and multiple prime notation is used to indicate similar elements in alternative embodiments.

Figure 1:
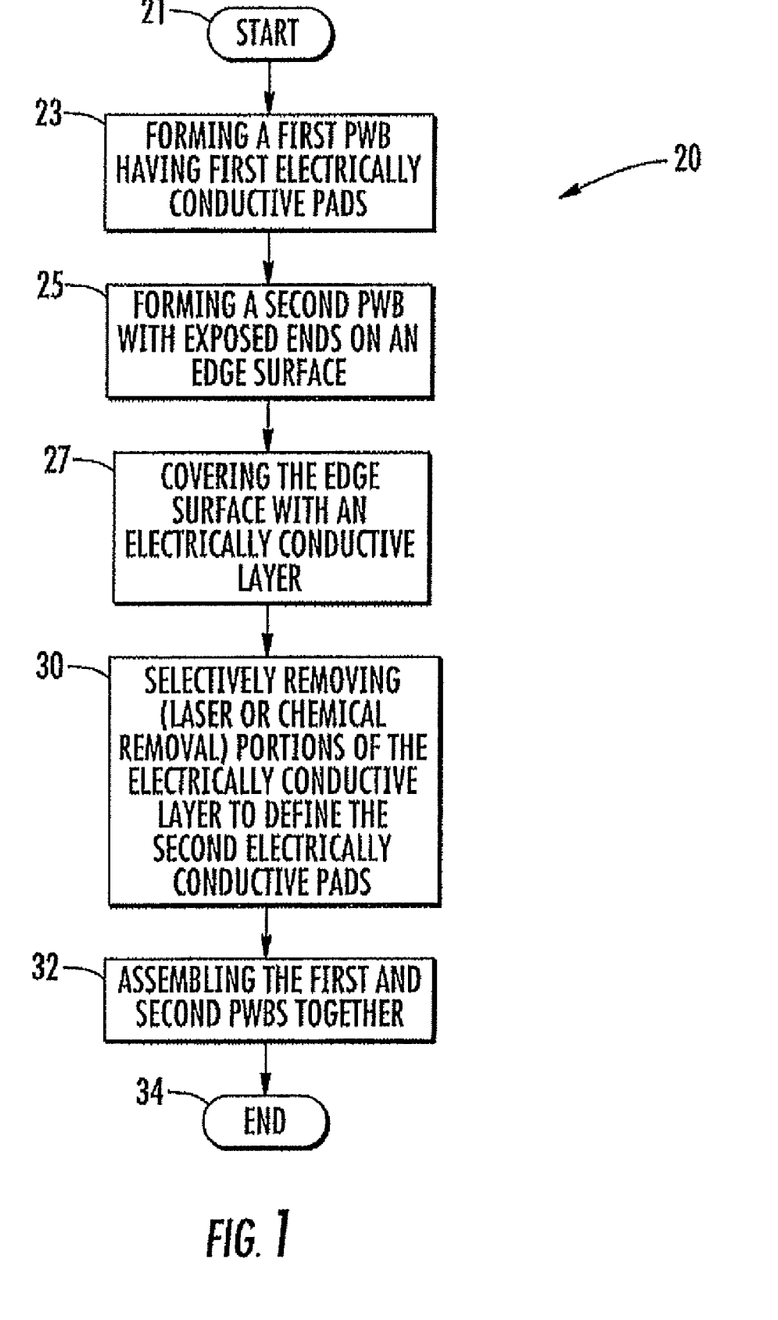
FIG. 1 is a flowchart illustrating a method for making a PWB assembly according to the present invention.
Figure 2:
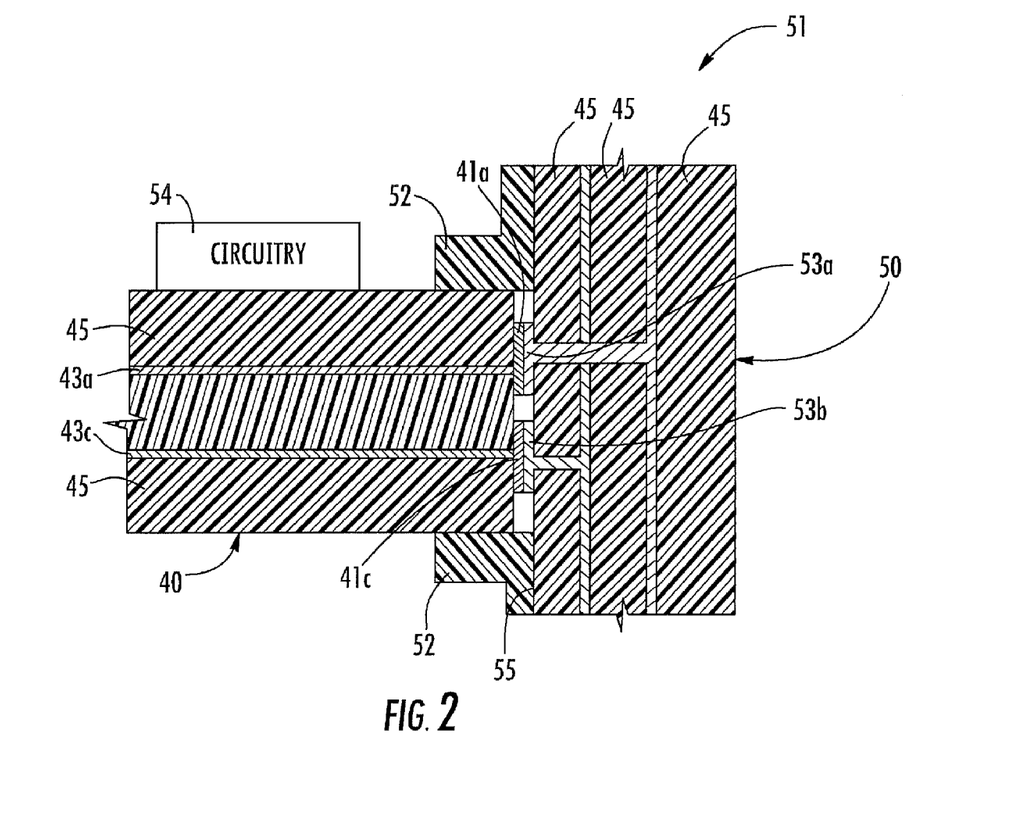
FIG. 2 is a schematic cross-sectional view of a PWB assembly made according to the method of FIG. 1.
Figure 3:
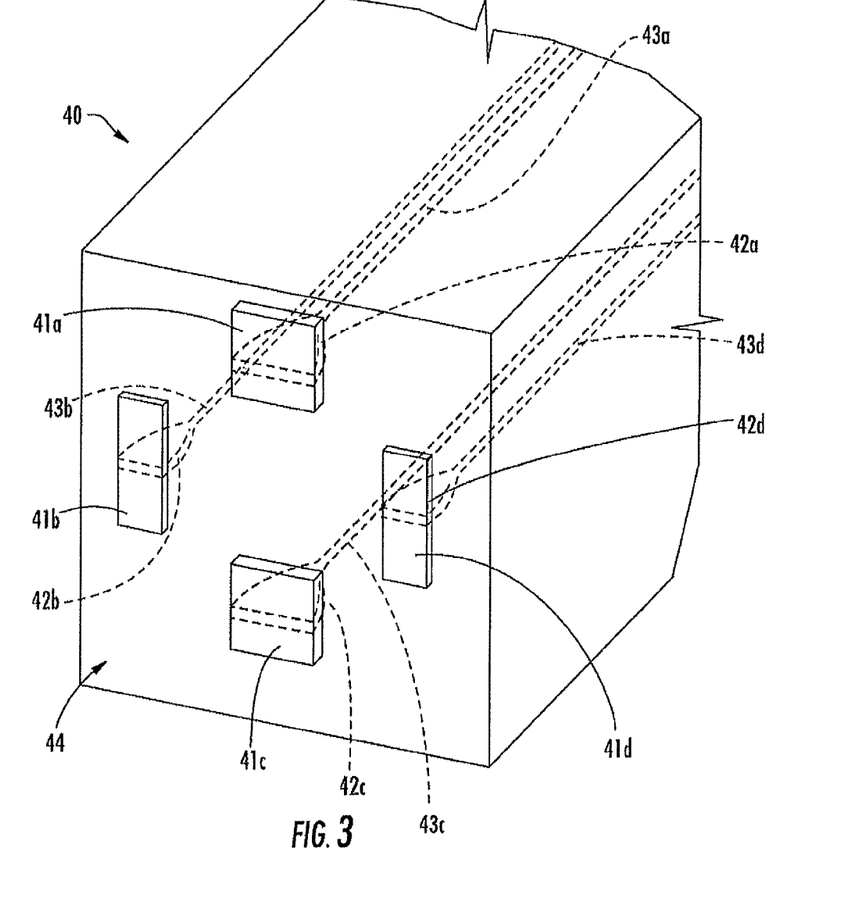
FIG. 3 is a schematic perspective end view of the second PWB shown in FIG. 2 according to the present invention.

Referring initially to FIGS. 1-3, a flowchart 20 illustrates a method for making a printed wiring board (PWB) assembly 51 that begins at Block 21. The method illustratively includes at Block 23 forming a first PWB 50 having a plurality of first electrically conductive pads 53a-53d. The first electrically conductive pads 53a-53d (only two of which are visible in FIG. 2, for clarity of explanation) are illustratively formed on a major surface 55 of the first PWB 50.

At Block 25, the method also illustratively includes forming a second PWB 40 including a plurality of electrically conductive traces 43a-43d (only two of which are visible in FIG. 2, for clarity of explanation) having exposed ends 42a-42d on an edge surface 44 of the second PWB. The exposed ends 42a-42d illustratively have an enlarged width and a same thickness relative to adjacent portions of the corresponding electrically conductive trace 43a-43d. The enlarged width of the exposed ends 42a-42d provides advantage over the milled cylinder ends of the prior art, for example, as in U.S. Patent Application Publication No. 2007/0107935 to Hash et al.

The edge surface 44 of the second PWB 40 is illustratively planar in shape. The first PWB 50 and the second PWB 40 each illustratively comprise a multi-layer circuit board including a plurality of dielectric layers 45 and conductive trace layers 43a-43d therebetween. Alternatively, the first PWB 50 may comprise a single/simple layer circuit board. In other words, at least the second PWB 40 comprises a multi-layer PWB. Moreover, circuitry 54 is mounted on the second PWB 40 and the first PWB 50.

The method also illustratively includes at Block 27 covering the edge surface 44 of the second PWB 40 with an electrically conductive layer, for example, a copper layer. The covering of the edge surface 44 may comprise, for example, plating, or deposition. The method illustratively includes at Block 30 selectively removing portions of the electrically conductive layer to define a plurality of second electrically conductive pads 41a-41d electrically connected to corresponding ones of the exposed ends 42a-42d of the electrically conductive trace 43a-43d. Additionally, the first electrically conductive pads 53a-53d may have different sizes, and adjacent ones of the second electrically conductive pads 41a-41d may have corresponding sizes.

The selective removal of the electrically conductive layer may comprise, for example, selective laser removal (laser ablation), selective chemical removal (chemical etching), or selective mechanical removal (milling). The laser ablation may be provided by a laser milling device, for example, as manufactured by the Micron Laser Corporation of Hillsboro, Oreg. As will be appreciated by those skilled in the art, other methods of selective removal may be used. Advantageously, the laser ablation removal of the electrically conductive layer may be cost effective and readily available. Moreover, since the removal step is performed on the complete second PWB 40, there are no alignment issues between second electrically conductive pads 41a-41d.

Moreover, laser ablation is accurate, for example, providing laser cutting geometries down to 0.002 inches. Laser ablation is also flexible in the shaping of the electrically conductive layer, for example, providing compatibility with a plurality of baseline interconnect technologies.

The method also illustratively includes at Block 32 assembling the first 50 and second 40 PWBs together so that the first 53a-53d and second 41a-41d electrically conductive pads are electrically coupled together to define the PWB assembly 51. Since the first electrically conductive pads 53a-53d are on the major surface 55 of the first PWB 50 and the second electrically conductive pads 41a-41d are formed on the edge surface 44 of the second PWB 40, the first and second PWBs, when assembled, are illustratively inclined at an angle to each other, for example, 90 degrees. Alternatively, the first 50 and second 40 PWBs may be assembled edge-to-edge, i.e. the first PWB would also include electrically conductive pads on its edge surface. The method ends at Block 34.

Figure 4:
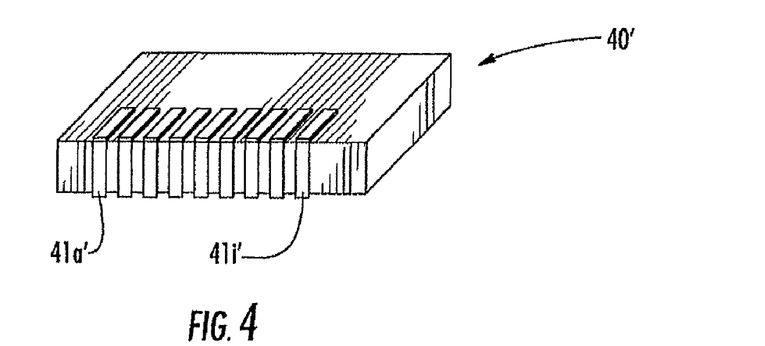
FIG. 4 is a schematic perspective view of another embodiment of the second PWB of the PWB assembly according to the present invention.

Referring now to FIG. 4, another embodiment of the second PWB 40' is now described. In this embodiment of the second PWB 40', those elements already discussed above with respect to FIGS. 2-3 are given prime notation and most require no further discussion herein. This embodiment differs from the previous embodiment in that the second PWB 40' includes the second electrically conductive pads 41a'-41i' being arranged in a pattern to define a series of parallel strips that wrap around the top and bottom of the edge surface 44'. The series of parallel strips are at a 0.5 mm pitch.

Figure 5:
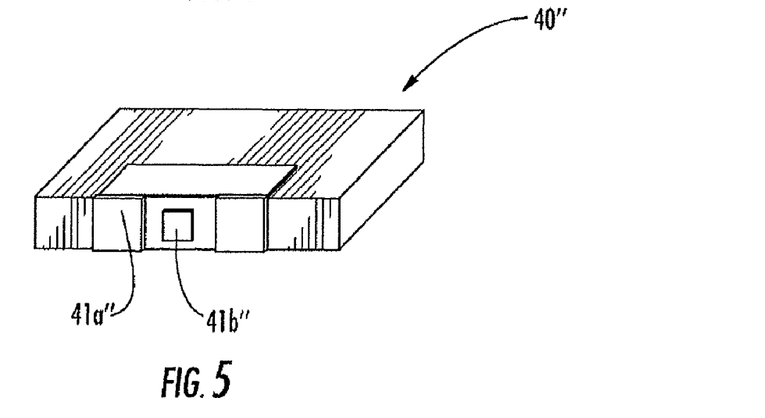
FIG. 5 is a schematic perspective view of yet another embodiment of the second PWB of the PWB assembly according to the present invention.

Referring now to FIG. 5, another embodiment of the second PWB 40" is now described. In this embodiment of the second PWB 40", those elements already discussed above with respect to FIGS. 2-3 are given double prime notation and most require no further discussion herein. This embodiment differs from the previous embodiment in that the second PWB 40" includes the second electrically conductive pads 41a"-41b" being arranged to define a coaxial connection, for example, a coaxial launch.

Figure 6:
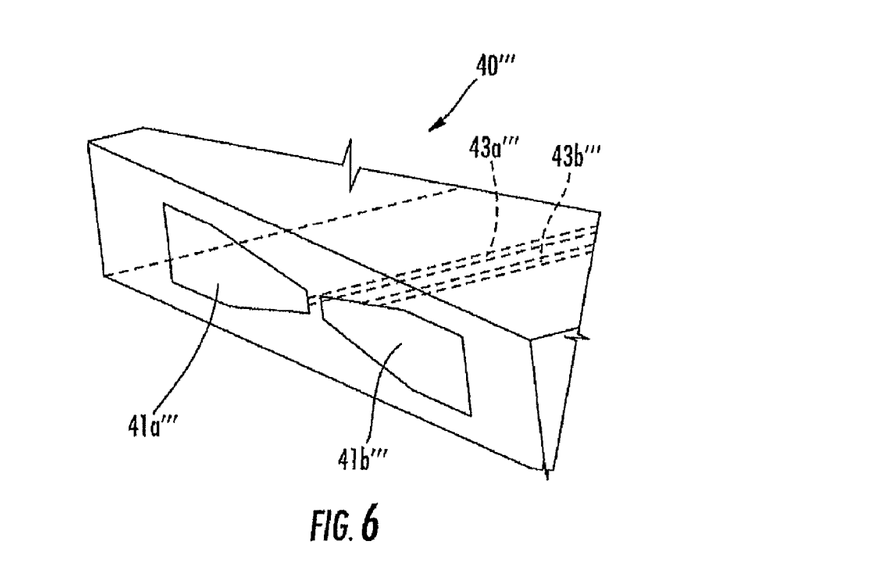
FIG. 6 is a schematic perspective view of still another embodiment of the second PWB of the PWB assembly according to the present invention.
Figure 7:
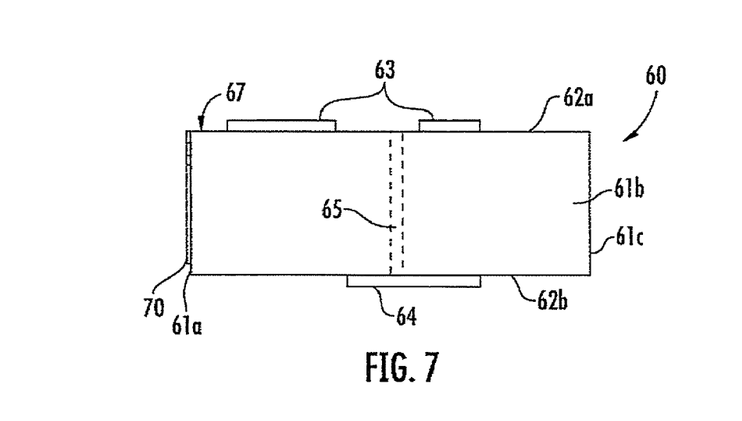
FIG. 7 is a schematic side elevational view of an electronic device according to the present invention.
Figure 8:
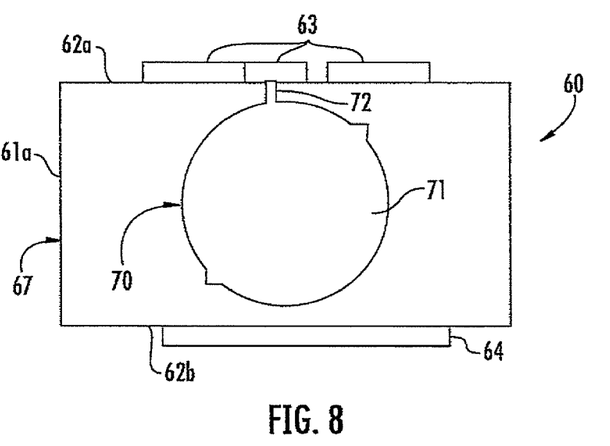
FIG. 8 is a schematic end view of the electronic device shown in FIG. 7.
Figure 9:
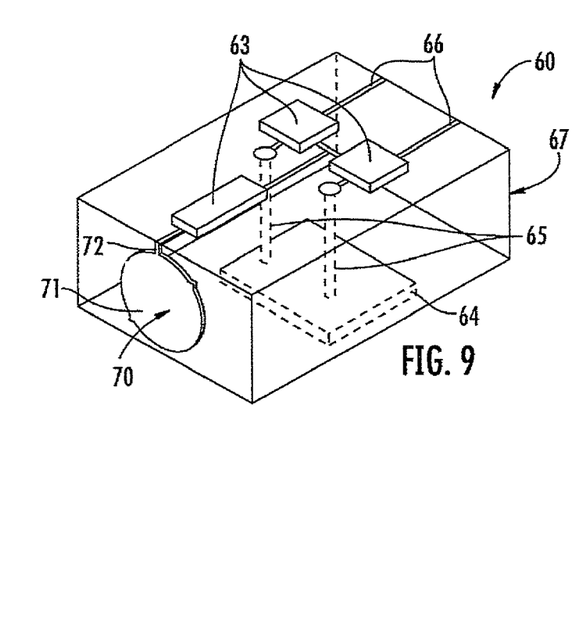
FIG. 9 is a schematic perspective view of the electronic device shown in FIG. 7.
Figure 10:
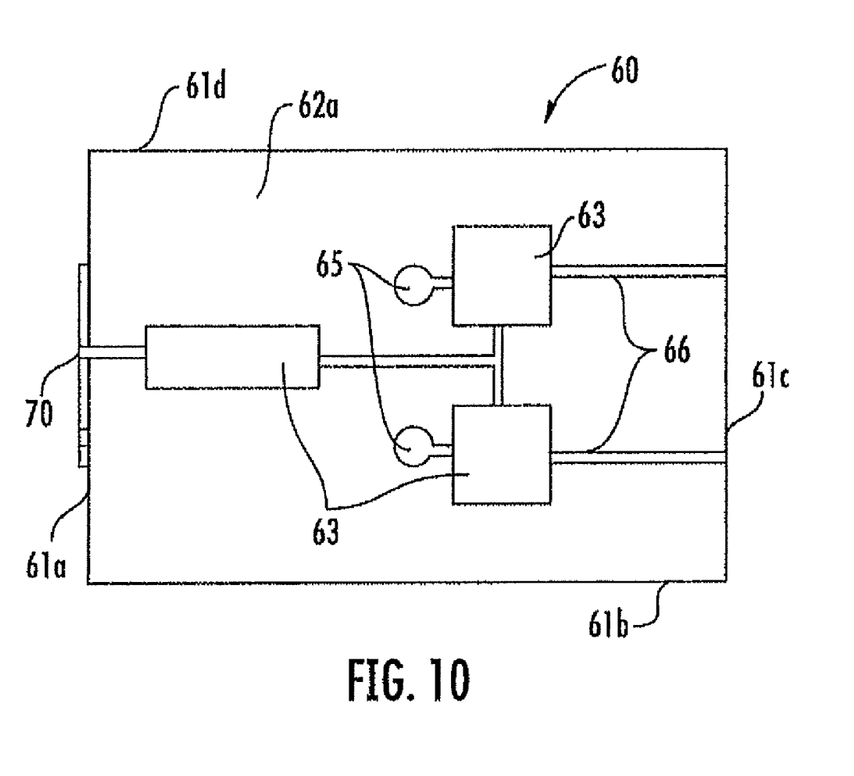
FIG. 10 is a schematic top plan view of the electronic device shown in FIG. 7.

Referring now to FIG. 6, another embodiment of the second PWB 40''' is now described. In this embodiment of the second PWB 40''', those elements already discussed above with respect to FIGS. 2-3 are given triple prime notation and most require no further discussion herein. This embodiment differs from the previous embodiment in that the second PWB 40''' includes the second electrically conductive pads 41a'''-41b''' being arranged to define an antenna for the circuitry carried by the second PWB.

Referring now to FIGS. 7-10, an electronic device 60 illustratively includes a multilayer circuit board 67 having opposing major surfaces 62a-62b and edge surfaces 61a-61d extending between the opposing major surfaces. The electronic device 60 illustratively includes wireless processing circuitry 63 on the first one of the (topside 62a) opposing major surfaces 62a-62b, and an antenna element 70 on one 61a of the edge surfaces 61a-61d. The wireless processing circuitry 63 may also comprise one or more of the following devices, for example, an amplifier, a phase shifter, and a filter. In other embodiments, the antenna element 70 may be on more than one edge surface 61a-61d. The multilayer circuit board 67 illustratively includes a plurality of conductive traces 66 coupling the antenna element 70 to the wireless processing circuitry 63.

Additionally, the electronic device 60 illustratively includes additional circuitry 64, for example, digital circuitry, on a second one (bottom side 62b) of the opposing major surfaces 62a-62b. The multilayer circuit board 67 illustratively includes a plurality of electrically conductive vias 65 extending between the opposing major surfaces 62a-62b for coupling the wireless processing circuitry 63 to the additional circuitry 64. Although not shown, the multilayer circuit board 67 may include a ground plane extending parallel to the opposing major surfaces 62a-62b for electrically shielding the wireless processing circuitry 63 from the additional circuitry 64.

Figure 16:
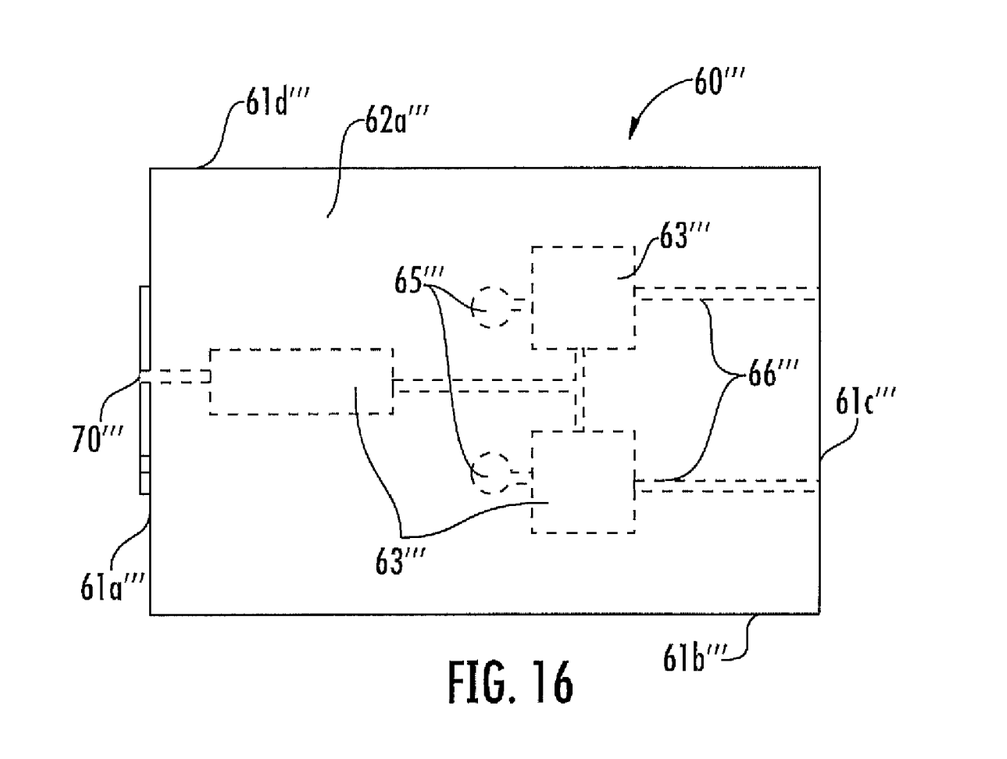
FIG. 16 is a schematic top plan view of another embodiment of the electronic device shown in FIG. 7.

Although the circuitry 63, 64 of the electronic device 60 is illustrated formed on the outer opposing major surfaces 62a-62b of the multilayer circuit board 67, the circuitry may be additionally or alternatively formed on internal layer surfaces. Indeed, in certain embodiments (FIG. 16), the conductive traces 66 (shown with dashed lines) and/or the circuitry 63, 64 may be completely formed on internal layer surfaces of the multilayer circuit board 67. In other words, the outer surfaces 61a-61d, 62a-62b of the multilayer circuit board 67 would be bare dielectric, providing greater mechanical resiliency.

More particularly, the antenna element 70 illustratively includes a feed portion 72 coupled to the conductive traces 66, and a radiative portion 71 coupled to the feed portion. Although illustrated as a patch antenna, as will be appreciated those skilled in the art, the antenna element 70 may have differing shapes and antenna types, for example, a dipole antenna, a monopole antenna, or a whip antenna.

Figure 11:
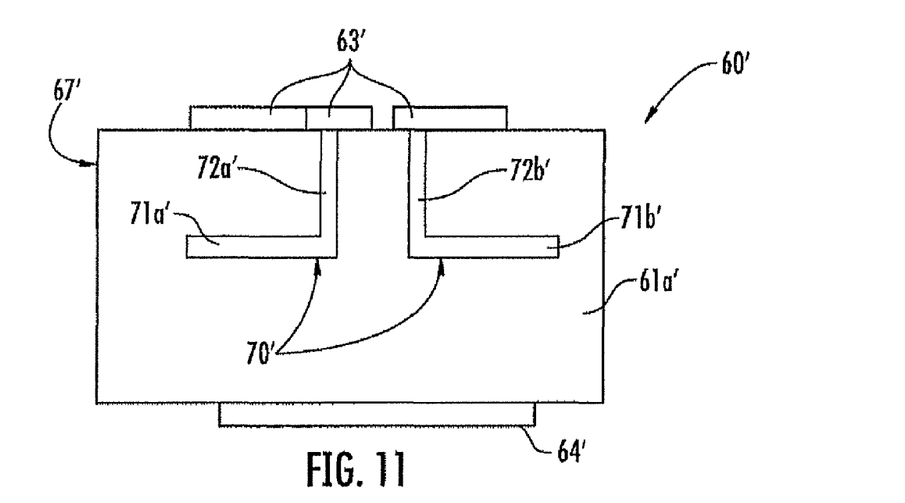
FIG. 11 is a schematic end view of another embodiment of the electronic device according to the present invention.

Referring now to FIG. 11, another embodiment of the electronic device 60' is now described. In this embodiment of the electronic device 60', those elements already discussed above with respect to FIGS. 7-10 are given prime notation and most require no further discussion herein. This embodiment differs from the previous embodiment in that the antenna element 70' comprises a dipole antenna element.

Figure 12:
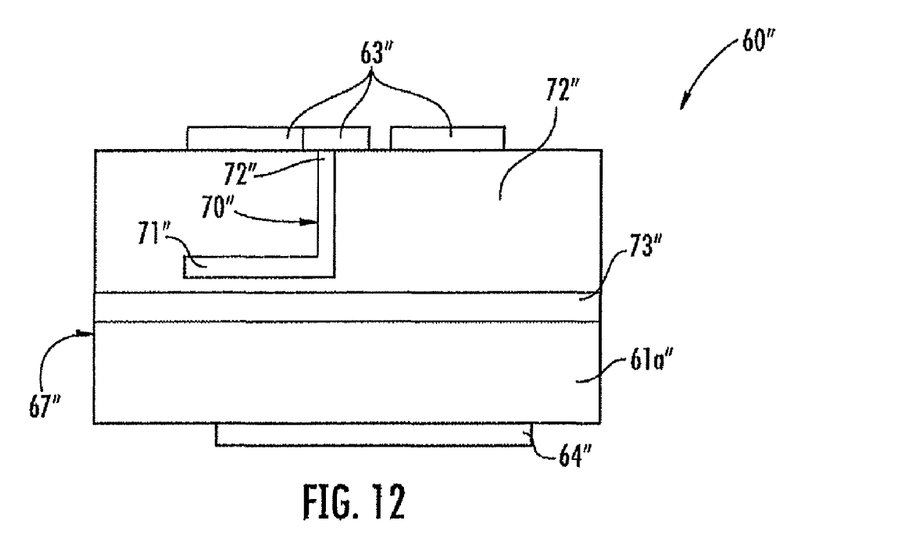
FIG. 12 is a schematic end view of yet another embodiment of the electronic device according to the present invention.

Referring now to FIG. 12, another embodiment of the electronic device 60" is now described. In this embodiment of the electronic device 60", those elements already discussed above with respect to FIGS. 7-10 are given double prime notation and most require no further discussion herein. This embodiment differs from the previous embodiment in that the antenna element 70" comprises a monopole antenna element. Moreover, the electronic device 60" further illustratively includes a ground plane 73" extending parallel to the opposing major surfaces 62a"-62b".

Figure 13:
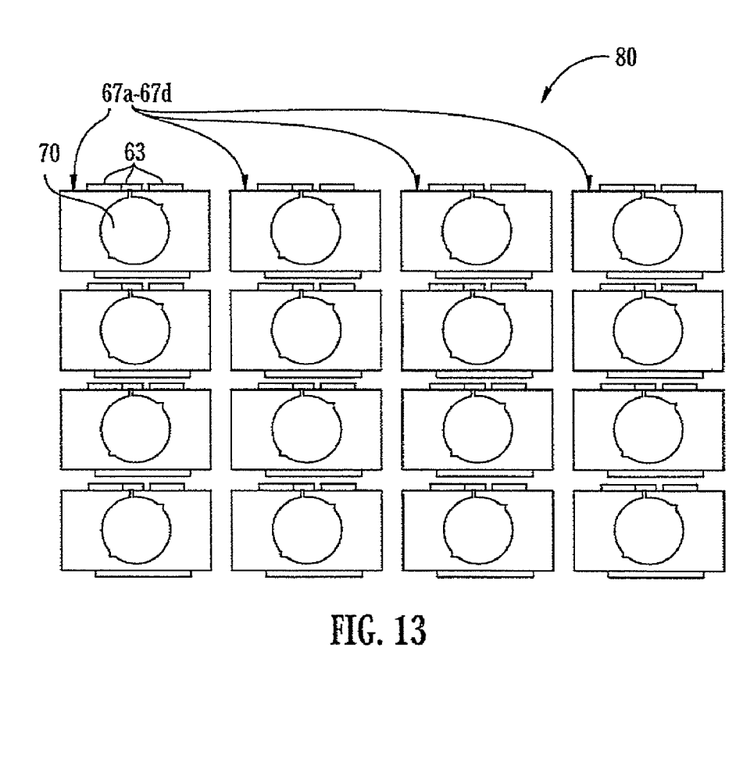
FIG. 13 is a schematic end view of a phased antenna array according to the present invention.
Figure 14:
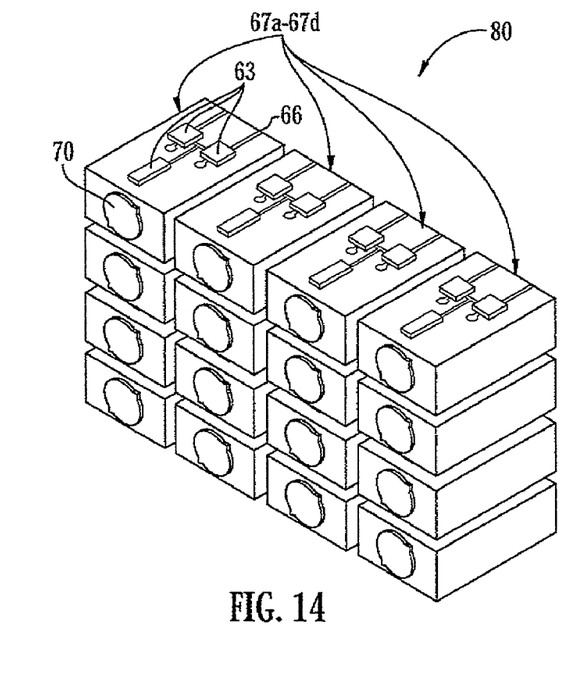
FIG. 14 is a schematic perspective view of the phased antenna array shown in FIG. 13.

Referring again to FIGS. 7-10 and now additionally to FIGS. 13-14, a phased array antenna 80 is shown and illustratively includes a plurality of multilayer circuit boards 67a-67d arranged in side-by-side orientation. Advantageously, since the patch antenna elements 70 are formed on the edge surfaces 61a-61d of the multilayer circuit boards 67a-67d, the circuit board real estate available for wireless processing circuitry 63 may be expanded in a dimension perpendicular to the antenna elements 70, i.e. the element-to-element pitch of the phased antenna array is not changed when additional circuitry is added. Accordingly, this advantageously allows for greater density in packaging.

Figure 15:
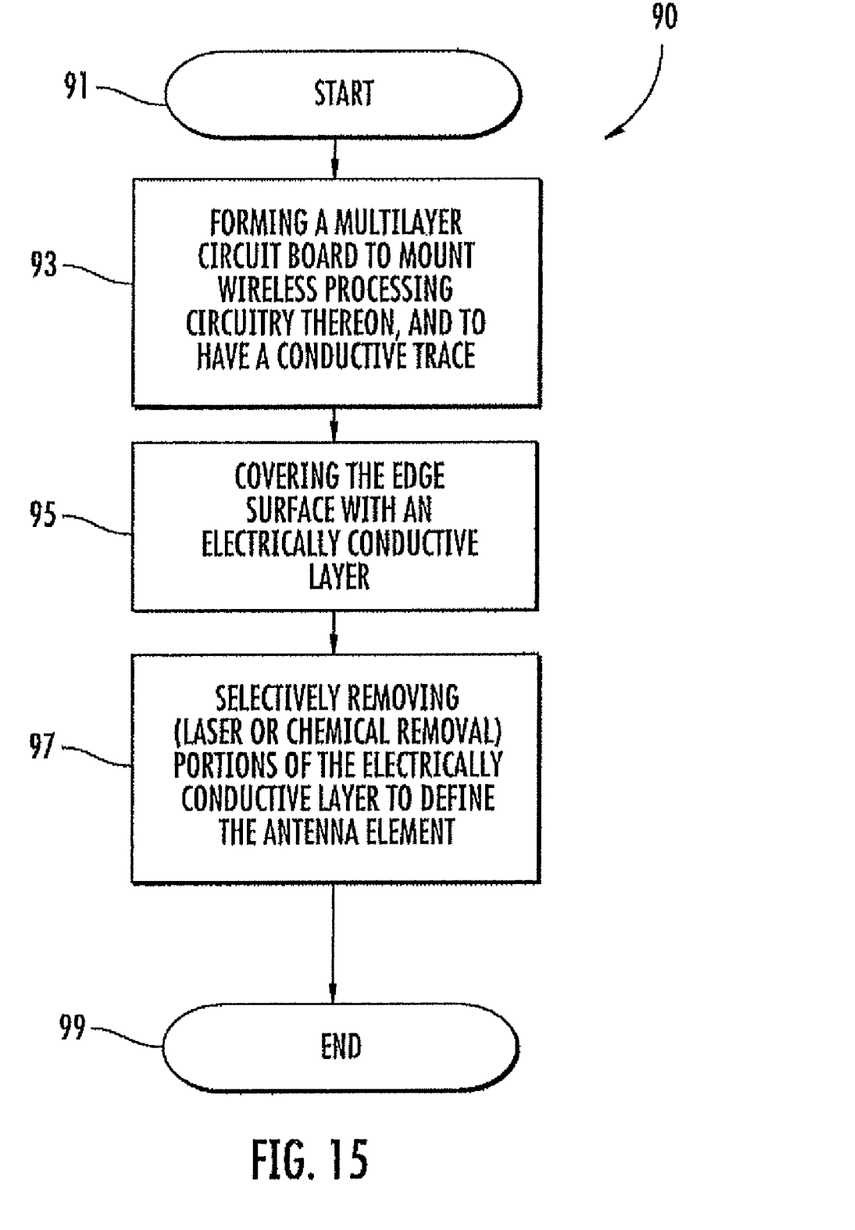
FIG. 15 is a flowchart illustrating a method for making the electronic device according to the present invention.

Referring again to FIGS. 7-10 and now additionally to FIG. 15, a flowchart 90 illustrates a method for forming at least one antenna element 70 on at least one edge surface 61a-61d of a multilayer circuit board 67. The method beings at Block 91 and includes at Block 93 forming the multilayer circuit board 67 having wireless processing circuitry 63 on at least one major surface 62a-62b thereof, and at least one conductive trace 66 thereon coupled to the wireless processing circuitry and having an exposed end on the edge surface of the multilayer circuit board.

At Block 95, the method illustratively includes covering the edge surface 61a-61d of the multilayer circuit board 67 with an electrically conductive layer. The method moves to Block 97 for selectively removing portions of the electrically conductive layer to define the antenna element 70 electrically connected to the exposed end of the conductive trace 66. The method ends at Block 99. As will be appreciated by those skilled in the art, this method may have other embodiments, modifications, and additions similar to those of the method disclosed above with respect to FIGS. 1-6.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for forming at least one antenna element on at least one edge surface of a multilayer circuit board, the multilayer circuit board to mount wireless processing circuitry on at least one major surface thereof, the multilayer circuit board to have at least one internal conductive trace and at least one conductive via coupled thereto to couple to the wireless processing circuitry, the at least one internal conductive trace having an exposed end on the at least one edge surface of the multilayer circuit board, the method comprising:
   covering the at least one edge surface of the multilayer circuit board with an electrically conductive layer; and
   selectively removing portions of the electrically conductive layer to define the at least one antenna element electrically connected to the exposed end of the at least one internal conductive trace, thereby coupling the at least one antenna element to the wireless processing circuitry.

2. The method according to claim 1 wherein selectively removing portions of the electrically conductive layer comprises selective laser removal.

3. The method according to claim 1 wherein selectively removing portions of the electrically conductive layer comprises selective chemical removal.

4. The method according to claim 1 wherein selectively removing portions of the electrically conductive layer comprises selective mechanical removal.

5. The method according to claim 1 wherein the at least one antenna element comprises:
   a feed portion coupled to the at least internal conductive trace; and
   a radiative portion coupled to the feed portion.

6. The method according to claim 1 wherein covering comprising plating.

7. The method according to claim 1 wherein covering comprising depositing.

8. The method according to claim 1 wherein forming the wireless processing circuitry comprises forming at least one of an amplifier, a phase shifter, and a filter.

9. A method for forming at least one antenna element on at least one edge surface of a multilayer circuit board, the multilayer circuit board to mount wireless processing circuitry on at least one major surface thereof, the multilayer circuit board to have at least one internal conductive trace and at least one conductive via to couple to the wireless processing circuitry, the at least one internal conductive trace having an exposed end on the at least one edge surface of the multilayer circuit board, the method comprising:
   plating the at least one edge surface of the multilayer circuit board with an electrically conductive layer; and
   selectively removing portions of the electrically conductive layer by laser etching to define the at least one antenna element electrically connected to the exposed end of the at least one internal conductive trace, thereby coupling the at least one antenna element to the wireless processing circuitry.

10. The method according to claim 9 wherein the at least one antenna element comprises:
   a feed portion coupled to the at least internal conductive trace; and
   a radiative portion coupled to the feed portion.

11. The method according to claim 9 wherein forming the wireless processing circuitry comprises forming at least one of an amplifier, a phase shifter, and a filter.

12. A method for making an electronic device comprising:
   forming a multilayer circuit board having opposing major surfaces and edge surfaces extending between the opposing major surfaces and having an internal conductive trace and a conductive via coupled thereto;
   forming wireless processing circuitry on at least one of the opposing major surfaces and coupled to the conductive via; and
   forming an antenna element on at least one of the edge surfaces and coupled to the internal conductive trace.

13. The method according to claim 12 wherein forming the antenna element comprises:
   covering the at least one edge surface of the multilayer circuit board with an electrically conductive layer; and
   selectively removing portions of the electrically conductive layer to define the antenna element electrically connected to the exposed end of the internal conductive trace.

14. The method according to claim 13 wherein selectively removing portions of the electrically conductive layer comprises at least one of selective laser removal, selective chemical removal, and selective mechanical removal.

15. The method according to claim 12 wherein forming the wireless processing circuitry comprises forming at least one of an amplifier, a phase shifter, and a filter.

16. A method for making a phased array antenna comprising:
   forming a plurality of multilayer circuit boards each having opposing major surfaces and edge surfaces extending between the opposing major surfaces and having an internal conductive trace and a conductive via coupled thereto;
   forming wireless processing circuitry on at least one of the opposing major surfaces and coupled to the conductive via;
   forming an antenna element on at least one of the edge surfaces and coupled to the internal conductive trace; and
   arranging the plurality of multilayer circuit boards in side-by-side relation.

17. The method according to claim 16 wherein forming the antenna element comprises:
   covering the at least one edge surface of the multilayer circuit board with an electrically conductive layer; and
   selectively removing portions of the electrically conductive layer to define the antenna element electrically connected to the exposed end of the internal conductive trace.

18. The method according to claim 17 wherein selectively removing portions of the electrically conductive layer comprises at least one of selective laser removal, selective chemical removal, and selective mechanical removal.

19. The method according to claim 16 wherein forming the wireless processing circuitry comprises forming at least one of an amplifier, a phase shifter, and a filter.

* * * * *

UNITED STATES PATENT AND TRADEMARK OFFICE
CERTIFICATE OF CORRECTION

PATENT NO.         : 8,217,842 B2                                   Page 1 of 1
APPLICATION NO.    : 13/240376
DATED              : July 10, 2012
INVENTOR(S)        : Pedersen et al.

It is certified that error appears in the above-identified patent and that said Letters Patent is hereby corrected as shown below:

In the Specification

Col. 1, Lines 4-5, please insert the following heading and corresponding statement at the beginning of the patent.

--Government Rights

This invention was made with U.S. Government support, and the U.S. Government has certain rights in this invention.--

Signed and Sealed this
Twenty-sixth Day of November, 2013

Margaret A. Focarino
*Commissioner for Patents of the United States Patent and Trademark Office*